(12) United States Patent
Sumida

(10) Patent No.: US 6,441,432 B1
(45) Date of Patent: Aug. 27, 2002

(54) HIGH VOLTAGE LATERAL SEMICONDUCTOR DEVICE

(75) Inventor: Hitoshi Sumida, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/442,023

(22) Filed: Nov. 17, 1999

(30) Foreign Application Priority Data

Nov. 20, 1998 (JP) .............................................. 10-330315

(51) Int. Cl.[7] .............................................. H01L 29/76

(52) U.S. Cl. ........................ 257/339; 257/339; 257/327; 257/328; 257/343

(58) Field of Search ................................ 257/343, 327, 257/328, 339

(56) References Cited

U.S. PATENT DOCUMENTS 5,633,521 A * 5/1997 Koishikawa ................ 257/336

* cited by examiner

Primary Examiner—Eddie Lee
Assistant Examiner—Joseph Nguyen
(74) Attorney, Agent, or Firm—Rossi & Associates

(57) ABSTRACT

A high voltage lateral semiconductor device is provided in which an n buffer region (14) surrounds an $n^+$ drain region (11), and an n drift region (3) surrounds the n buffer region (14), while a p well region (44) surrounds the n drift region (3). No $n^+$ source region is formed in a circular arc portion (47) of the p well region (44), but an $n^+$ source region (46) is formed in each straight portion (48) of the p well region (44). A $p^+$ contact region (45) surrounds the p well region (44) and the $n^+$ source region (46). A gate oxide film is formed on a part of the $n^+$ source region (46) located close to the n drift region, and on the p well region (44) and the outer peripheral portion of the n drill region (3), and a gate electrode is formed on the gate oxide film.

4 Claims, 8 Drawing Sheets

US 6,441,432 B1

HIGH VOLTAGE LATERAL SEMICONDUCTOR DEVICE

FIELD OF THE INVENTION

The present invention relates to a high voltage lateral semiconductor device that is formed on an SOI (Silicon-On-Insulator) substrate fabricated by a wafer bonding method.

BACKGROUND OF THE INVENTION

While the development of isolation techniques such as junction isolation and dielectric isolation in recent years, high voltage power ICs have been extensively developed wherein high voltage devices, such as diodes, insulated gate bipolar transistors (hereinafter referred to as "IGBT"), and MOSFET, which have lateral structures, are integrated with a drive circuit, control circuit and a protection circuit for the devices on a single silicon substrate. In particular, the dielectric isolation technique that employs an SOI substrate fabricated by a wafer bonding method along with a trench-formation technique enables integration of a plurality of high voltage bipolar devices (such as bipolar transistors and IBGT), thus permitting significantly extended applications of high voltage power ICs. For example, this technique permits formation of a totem pole circuit using IGBTs in a single chip, and the use of IGBTs in an integrated circuit, such as an IC for driving a display, that is capable of generating a plurality of outputs.

In the development of high voltage power IC, it is highly desired to improve the performance of high voltage output devices for directly driving a load, and also improve the characteristics of an output circuit including the output devices. High voltage MOSFETs are essential devices in the configuration of the output circuit. Even where the MOSFET is not used as an output device, therefore, the output characteristics of high voltage power IC are greatly influenced by the performance of the high voltage MOSFETs, as well as that of the output devices for driving a load.

FIG. 5 illustrates an output circuit of a high voltage power IC by way of example. This circuit is incorporated in a high voltage power IC adapted for driving a flat panel display. In FIG. 5, VL, $V_{in}1$, $V_{in}2$, Vss, VH, and $V_{out}$ represent respective terminals of the circuit, more specifically, VL is denotes a high-potential terminal of a low-voltage power supply, $V_{in}1$, $V_{in}2$ denote input terminals of a shift register 21. Vss denote a common low-potential terminal (ground terminal) of the low-voltage power supply and high-voltage power supply, VH is a high-potential terminal of the high-voltage power supply, and $V_{out}$ denotes an output terminal. The output circuit includes output devices N1 and N2 that consist of IGBTs, diodes D1, D2, p channel MOSFET P1, n channel MOSFET N3, Zener diode ZD, and resistances R1, R2. The output circuit further includes a buffer 19, a level shifter 20 and a shift register 21.

The operation of the above-described circuit will be now explained. Signals for driving the output devices N1, N2 are applied from $V_{in}1$ and $V_{in}2$ to the shift register 21, and the signal for driving the device N2 is fed to the gage of the p channel MOSFET P1 via the level shifter 20. As a result, the p channel MOSFET P1 is turned on, and the output device N2 is turned on. At the same time, an OFF signal is applied to the output device N1 via the buffer 19 so that the device N1 is turned off. The p channel MOSFET P1 is then turned off so that the n channel MOSFET N3 is turned on, whereby the output device N2 is turned off while the output device N1 is turned on. In this circuit, the devices N1, N2, which are IGBTs, serve as output devices for driving a load, and both of the devices N3, P1 consist of lateral MOSFET having a high breakdown voltage. Although the devices N3, P1 do not serve to directly drive the load, they play an important role in driving the output devices N1, N2. If the characteristics, such as a breakdown characteristic, of these devices N3, P1 are unsatisfactory or poor, the high voltage power IC cannot provide desired output characteristics even if the output devices N1 N2 themselves exhibit good characteristics. Thus, it is important in the high voltage power IC to ensure sufficiently high breakdown voltage of the lateral MOSFETs N3, P1 of the output circuit, while assuring good characteristics of the output devices.

FIG. 6 is a cross-sectional view showing a principal part of a lateral MOSFET formed on an SOI substrate. The MOSFET of FIG. 6 includes an n type semiconductor substrate 40 as a first conductivity type semiconductor substrate, and is adapted to form an n type channel therein.

To form the lateral MOSFET, a bonding oxide film 2 is formed on a support substrate 1 in the form of an n type or p type semiconductor substrate, and the n type semiconductor substrate 40 is bonded onto the oxide film 2, and then polished, to thus provide an SOI substrate 70. Thereafter, a p well region 4, a $p^+$ contact region 5, and an $n^+$ source region 6 are formed in a surface layer of the n type semiconductor substrate 40. An n buffer region 14 is formed in the semiconductor substrate 40 apart from the p well region 4, and an $n^+$ drain region 11 is formed in a surface layer of the n buffer region 14. The n type semiconductor substrate 40 that is interposed between the p well region 4 and the n buffer region 14 provides an n drift region 3. A gate electrode 8 is formed on a gate oxide film 7 over the p well region 4. A source electrode 9 is formed in contact with the $n^+$ source region 6 and the $p^+$ contact region 5, and a drain electrode 12 is formed on the $n^+$ drain region 11. The source electrode 9, gate electrode 8, and the drain electrode 12 are connected to a source terminal S, a gate terminal G, and a drain terminal D, respectively.

In the MOSFET having a lateral structure as shown in the cross-sectional view of FIG. 7, the source electrode 9, gate electrode 8 and the drain electrode 12 are all formed on the same surface of the semiconductor substrate. The support substrate 1 is normally fixed at the ground potential, namely, the support substrate 1 is normally grounded. The device is insulated from the support substrate 1 by the bonding oxide film 2 interposed therebetween. In operation, electrons that constitute current are injected from the $n^+$ source region 6 into the $n^+$ drift region 3 through an n channel, and then flow into the $n^+$ drain region 11 through the n buffer region 14.

FIG. 7 is a potential distribution diagram showing the potential distribution inside the device when a high voltage is applied to the lateral MOSFET on the SOI substrate. The breakdown voltage of the device used in this simulation is 320 V. FIG. 7 shows the results of the potential distribution obtained in a simulation test in which the $n^+$ source region 6, $p^+$ contact region 5 and gate electrode 8 are grounded, and a voltage of 320 V is applied to the drain region 11. In FIG. 7, equipotential lines 16 are drawn for every 10 V, namely, each interval between adjacent equipotential lines represents a 10 V potential difference. In this example, the bonding oxide film 2 of the SOI substrate has a thickness of 2 μm, which is 1 μm thicker than that of the device of a preferred embodiment that will be described later. The support substrate is not illustrated in FIG. 7.

It will be understood from FIG. 7 that the potential as represented by the equipotential lines 16 becomes higher as the location of measurement gets closer to the n⁺ drain region 11, and that an increased number of equipotential lines 16 are present on the side of the n⁺ drain region 11. Namely, when a high voltage is applied to the lateral MOSFET formed on the SOI substrate, the voltage within the device is maintained on the side of the n⁺ drain region 11. With the n buffer region 14 provided in this example, a high density of equipotential lines 16 are present at around the n buffer region 14.

FIG. 8 shows a surface pattern of the lateral MOSFET having the cross-sectional structure of FIG. 6. In FIG. 8, the pattern of the surface electrodes are not illustrated. The lateral MOSFET generally has a surface pattern in which the n⁺ source region 6, p well region 4, n buffer region 14 and n⁺ drain region 11 are arranged in a comb-shaped pattern. Where one combination of the n⁺ source region 6, p well region 4, n buffer region 14 and n⁺ drain region 11 is called "unit cell", the surface pattern of the device consists of unit cells that are arranged in a certain form. The number of the unit cells to be arranged is determined by the magnitude of the current required to flow through the device. The region interposed between the p well region 4 and n⁺ buffer region 14 (or n⁺ drain region 11 in the absence of the n⁺ buffer region 14) is called n drift region 3, and the width of the n drift region 3 is determined by the required breakdown voltage of the device.

The cell pattern of FIG. 8 consists of three portions. The first region is a portion in which the p well region 4 and n⁺ drain region 11 are disposed in parallel with each other. The second region is a portion in which an edge portion (a distal end portion of each tooth of the comb pattern) of the n⁺ drain region 11 is surrounded by the n source region 6. The third region is a portion in which an edge portion (a distal end portion of each tooth of the comb pattern) of the n⁺ source region 6 is surrounded by the n⁺ drain region 11. Here, the second region is called "drain corner" 17, and the third region is called "source corner" 18. The present invention is concerned with the drain corner 17.

Where a multiplicity of unit cells constitute one device, the surface pattern of the device is formed of the three portions as described above. Where the rated current of the device is small, however, the n⁺ source region 6 or n⁺ drain region 11 is completely surrounded by the other of these regions, and therefore only one of the drain corner 17 and source corner 18 is present while the other corner is not present.

For instance, no source corner 18 exists in a device having a surface pattern in which an n⁺ drain region 53 is completely surrounded by an n⁺ source region 50 as shown in FIG. 9. To the contrary, no drain corner 17 exists in a device having a surface pattern in which the n⁺ source region 50 is surrounded by the n⁺ drain region 53. In many cases, only drain corners 17 are present as shown in FIG. 9. It is to be noted that p well region and n buffer region are not illustrated in FIG. 9.

In the meantime, the ON breakdown voltage, as well as the OFF breakdown voltage, is an important characteristic of lateral MOSFETs. The ON breakdown voltage may be defined as the voltage that appears just before the MOSFET breaks down due to avalanche multiplication, when a certain gate voltage is applied to the MOSFET to cause ON current determined by the gate voltage to flow through the MOSFET, and the voltage is kept increased with the ON current flowing through the device. The OFF breakdown voltage is defined as avalanche voltage that causes avalanche multiplication in the state in which leakage current is flowing while no gate voltage is being applied to the MOSFET.

It is assumed from the potential distribution of FIG. 7 and the surface pattern of FIG. 8 that the highest electric field is the lateral MOSFET formed on the SOI substrate 70 is produced in the drain corner 17 in which the n⁺ drain region 11 is shaped in a convex form. As shown in FIG. 10, electron streams 49, i.e., streams of electrons as majority carriers injected from the n⁺ source region 6, are concentrated at the drain corner 17 as defined by a circle 60 in FIG. 10. Thus, the drain corner 17, which has a high electric field and an increased number of electrons as majority carriers, is the weakest region in terms of the ON breakdown voltage, namely, has the lowest ON breakdown voltage.

Since the avalanche multiplication due to large ON current causes the MOSFET to break down upon turn-on thereof, the ON breakdown voltage is normally lower than the OFF breakdown voltage at which avalanche multiplication takes place due to the leakage current.

The lateral MOSFET formed on the SOI substrate 70, in which the bonding oxide film prevents a depletion layer from reaching the support substrate 1, tends to be subjected to a stronger electric field therein and have a reduce ON breakdown voltage, as compared with a lateral MOSFET formed on a thick semiconductor substrate. In addition, the ON breakdown voltage is further reduced because the streams 49 of electrons as majority carriers injected from the source side are narrowed and concentrated at around the drain region, and also because the device is surrounded by the oxide film which may deteriorate heat radiation.

SUMMARY OF THE INVENTION

It is therefore an object of the present invention to provide a high voltage lateral semiconductor device which is formed on an SOI substrate, and has an increased ON breakdown voltage.

To accomplish the above object, the present invention provides a high voltage lateral semiconductor device, which comprises: a first semiconductor substrate; a first-conductivity-type second semiconductor substrate that is bonded to the first semiconductor substrate with an oxide film interposed therebetween, to provide a bonded substrate structure, the second semiconductor substrate being polished to have a desired thickness; a second-conductivity-type well region formed in a selected portion of a surface layer of the second semiconductor substrate; a high-impurity-concentration second-conductivity-type contact region formed in a selected portion of a surface layer of the second-conductivity-type well region; a first-conductivity-type source region formed in a selected portion of the surface layer of the second-conductivity-type well region, such that the source region overlaps the second-conductivity-type contact region; a gate electrode layer formed on a gate insulating film, over a part of the second-conductivity-type well region that is interposed between the first-conductivity-type source region and the second semiconductor substrate; a source electrode formed on the second-conductivity-type contact region and the first-conductivity-type source region; a high-impurity-concentration first-conductivity-type drain region that is formed in a selected portion of the surface layer of the second semiconductor substrate, apart from the second-conductivity-type well region; and a drain electrode formed on the first-conductivity-type drain region; wherein a surface pattern including the second-conductivity-type well region and the first-conductivity-type drain region is formed in an island-like shape in which one of the well region and the drain region surrounds the other thereof, or in a comb-like shape in which the well region and the drain region surround each other; and wherein the first-conductivity-type source region is not formed at a location where an edge line of the second-conductivity-type well region is opposed to an edge line of the first-conductivity-type drain region, and the length of the edge line of the second-conductivity-type well region is larger than that of the edge line of the first-conductivity-type drain region.

With the semiconductor device constructed as described above, the first-conductivity-type source region is not formed at the location where the first-conductivity-type drain region would be otherwise surrounded by the source region. With this arrangement, almost no stream of electrons appear in the circular arc portion of the drain corner, thus assuring an increased ON breakdown voltage.

In one preferred form of the invention, a high-impurity-concentration second-conductivity-type semiconductor region is formed at the location where the first-conductivity-type source region is not formed.

By controlling the impurity concentration of the second-conductivity-type semiconductor region to be higher than that of the second-conductivity-type well region, an inversion layer is prevented from being formed in this semiconductor region, and electron streams can be further reduced in the circular arc portion of the drain corner, thus assuring a further increased ON breakdown voltage.

In another preferred form of the invention, a first-conductivity-type buffer region having a higher impurity concentration than the second semiconductor substrate is formed apart from the second-conductivity-type well region, so as to surround the first-conductivity-type drain region.

With the above arrangement, a depletion layer that spreads along the surface of the semiconductor substrate extends to a limited length, so that the ON breakdown voltage can be increased even if the distance between the second-conductivity-type well region and the first-conductivity-type drain region is reduced.

Since the first-conductivity-type source region that supplies majority carriers is not formed in the circular arc portion of the drain corner as described above, the majority carriers are prevented from being injected into a conventionally high-electric-field region, and therefore avalanche multiplication can be suppressed in the drain corner. Consequently, the ON-state breakdown characteristic of the device can be improved.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 1:
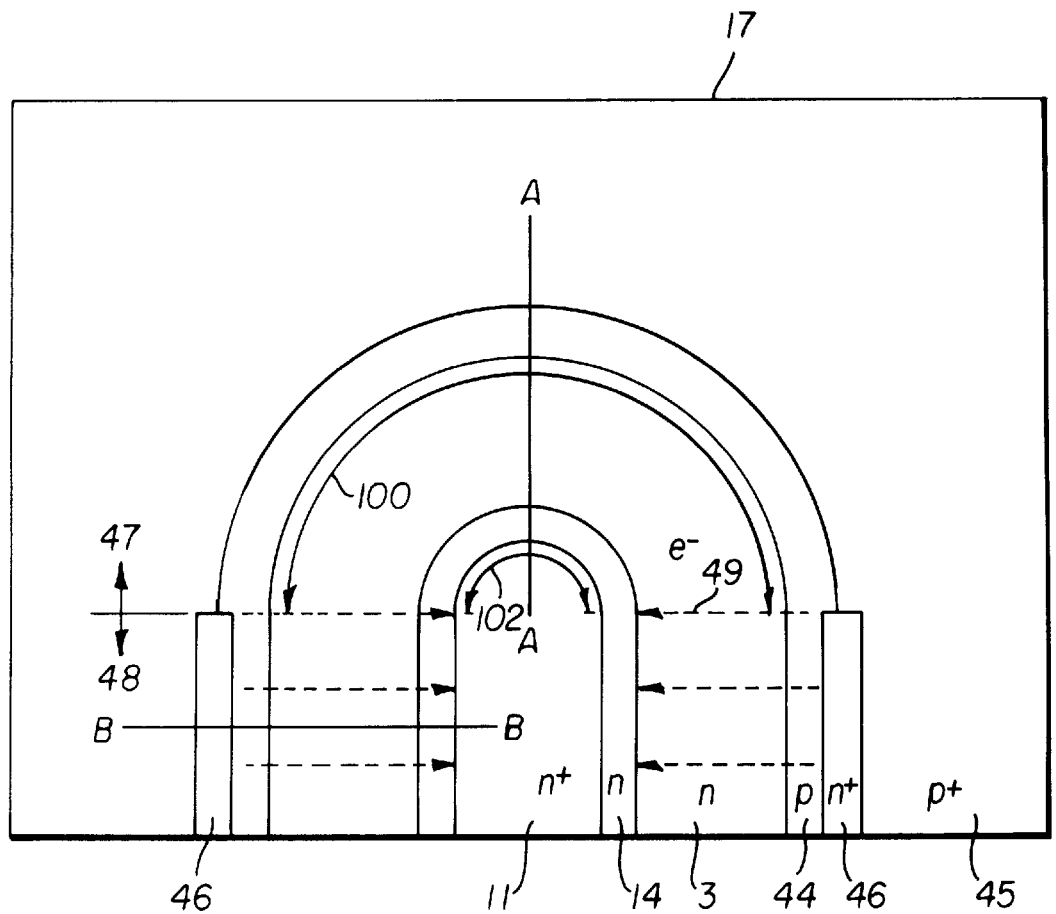
FIG. 1 is a plan view showing a drain corner of a high voltage lateral semiconductor device according to the first embodiment of the present invention.

FIG. 1 is a plan view showing a drain corner of a high voltage lateral semiconductor device according to the first embodiment of the present invention. The semiconductor device having the drain corner of FIG. 1 takes the form of an n channel MOSFET. Needless to say, the following description may be applied to a p channel MOSFET by reversing the conductivity type of each region.

Figure 8:
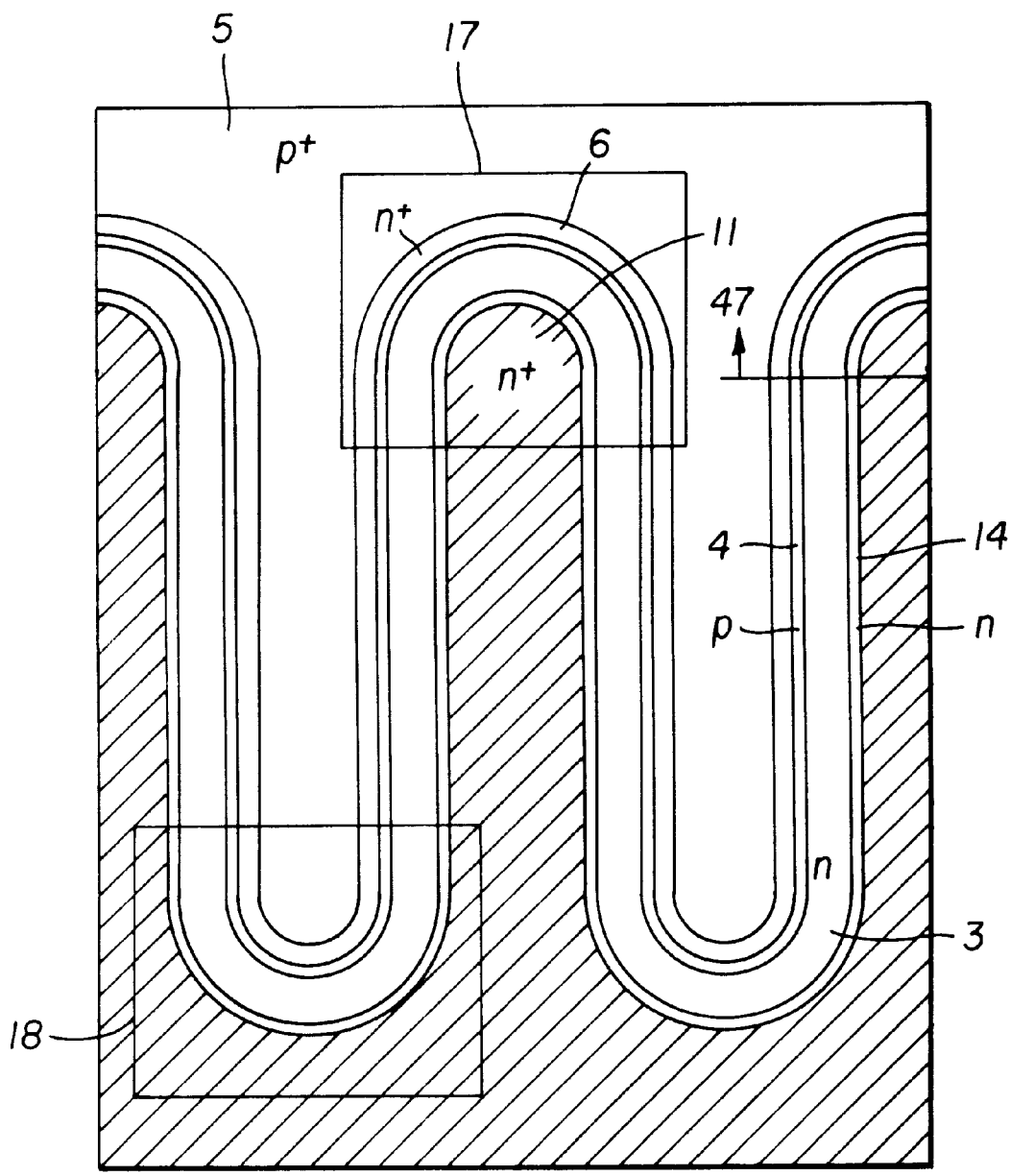
FIG. 8 is a view showing a surface pattern of the lateral MOSFET having the cross-sectional structure of FIG. 6.

The plan view of FIG. 1 is an enlarged view corresponding to a part of FIG. 8 in which the drain corner is illustrated. An n buffer region 14 surrounds an $n^+$ drain region 11, and an n drift region 3 surrounds the n buffer region 14, while a p well region 44 surrounds the n drift region 3. The $n^+$ source region 6 as shown in FIG. 8 is not formed in a circular arc portion 47 of the p well region 44, but an $n^+$ source region 46 is formed in each straight portion 48 of the p well region 44. A $p^+$ contact region 45 surrounds the p well region 44 and the $n^+$ source region 46. A gate oxide film is formed on a part of the $n^+$ source region 46 located close to the n drift region, and on the p well region 44 and the outer peripheral portion of the n drift region 3. A gate electrode that is not illustrated in FIG. 1 is formed on the gate oxide film.

Figure 10:
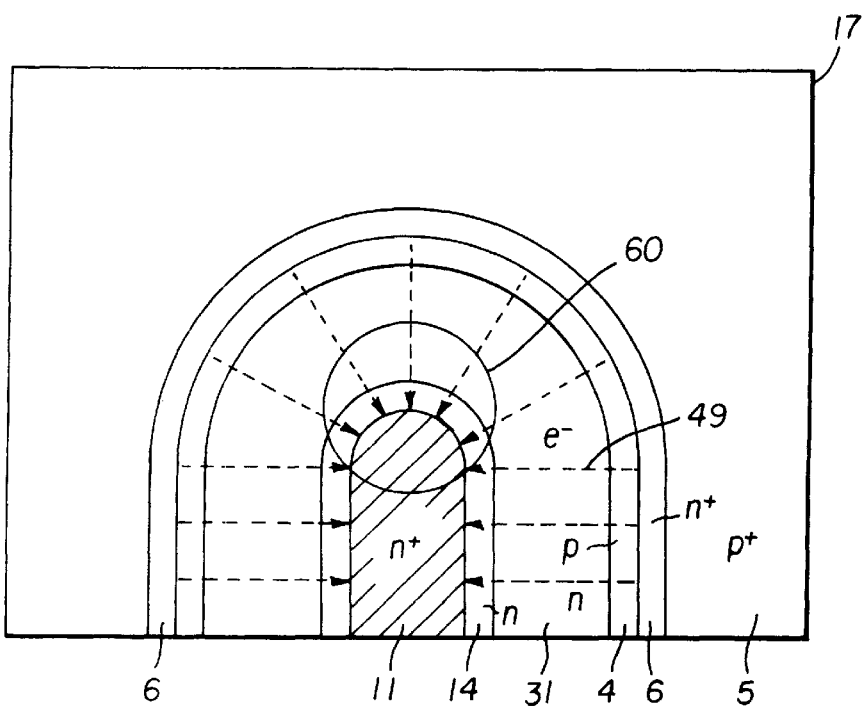
FIG. 10 is a view showing the state in which streams of electrons are concentrated at the drain corner.

The $n^+$ source region 6 of FIG. 8 that supplies electrons as majority carriers is not formed in the circular arc portion 47 of the drain corner 17. With no $n^+$ source region formed in this region 47, electron streams 49 are prevented from flowing into the $n^+$ drain region 11 as shown in the circle 60 of FIG. 10, and thus avalanche multiplication can be suppressed in the circular arc portion 47 of FIG. 1. Consequently, the ON breakdown characteristic of the device is improved due to the elimination of the portion having a low ON breakdown voltage.

Figure 9:
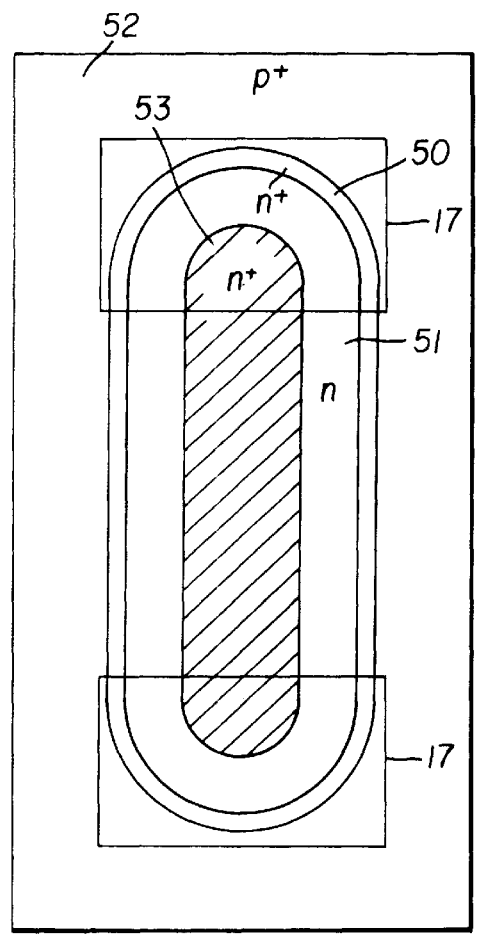
FIG. 9 is a plan view showing another surface pattern in which only drain corners are present.

In the circular arc portion 47 of the drain corner 17 of FIG. 1, the length of the edge line of the $p^+$ well region 100 (i.e., the length of the pn junction between the $p^+$ well region 44 and the n drift region 3) is larger than the length of the edge line of the $n^+$ drain region 102 (i.e., the length of the boundary between the $n^+$ drain region 11 and the n buffer region, or the n drift region where no n buffer region is provided). The present embodiment is also effective in the case of an island-like $n^+$ drain region as shown in FIG. 9.

Figure 2A:
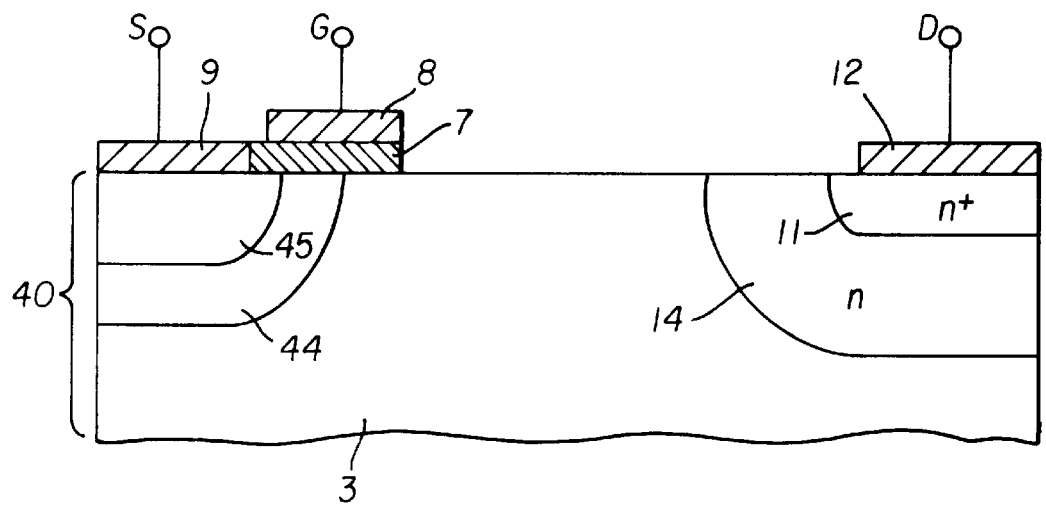
FIG. 2(a) is a cross-sectional view of a principal part of the drain corner of FIG. 1, taken along line A—A of FIG. 1.
Figure 2B:
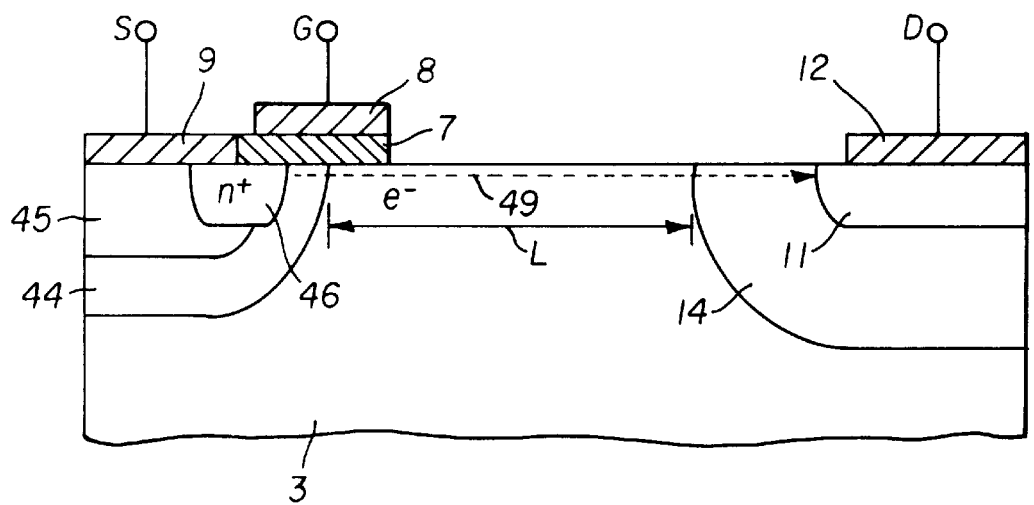
FIG. 2(b) is a cross-sectional view of the drain corner of FIG. 1, taken along line B—B of FIG. 1.

FIGS. 2(a) and 2(b) are cross-sectional views of principal parts of the drain corner of FIG. 1, wherein FIG. 2(a) is a cross-sectional view of the circular arc portion 47, taken along line A—A of FIG. 1, and FIG. 2(b) is a cross-sectional view of the straight portion 48, taken along line B—B of FIG. 1. The support substrate 1 and the bonding oxide film 2 as shown in FIG. 6 are omitted from FIGS. 2(a) and 2(b).

Figure 6:
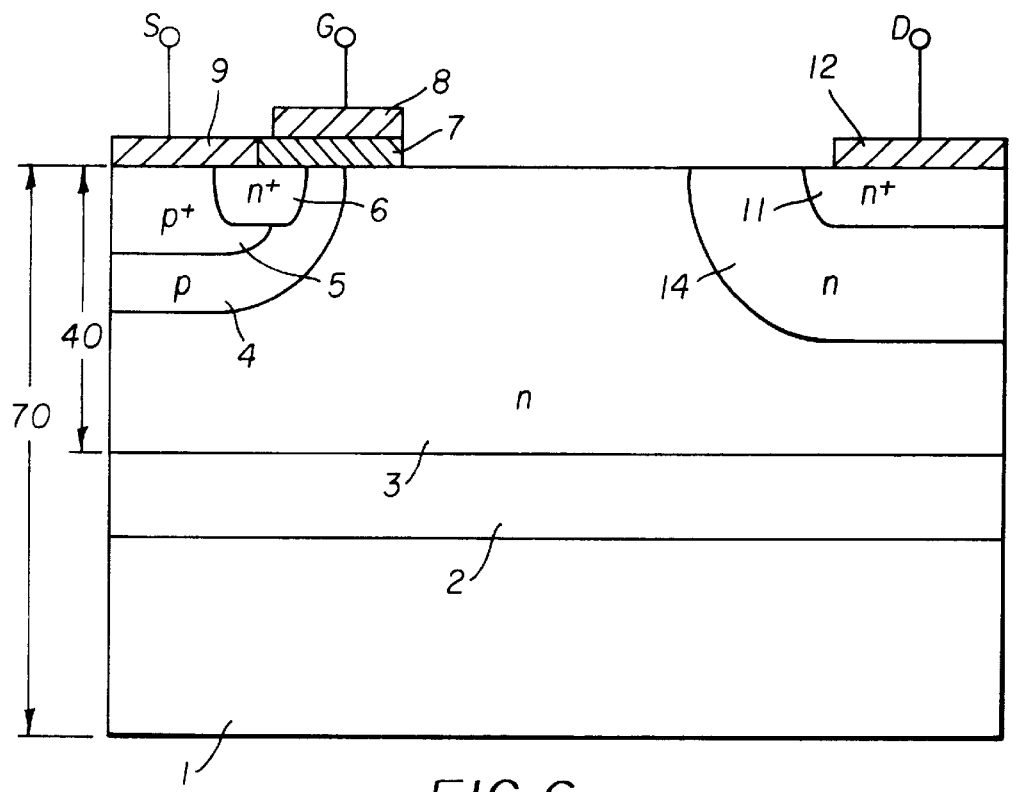
FIG. 6 is a cross-sectional view showing a principal part of a lateral MOSFET formed on an SOI substrate.
Figure 7:
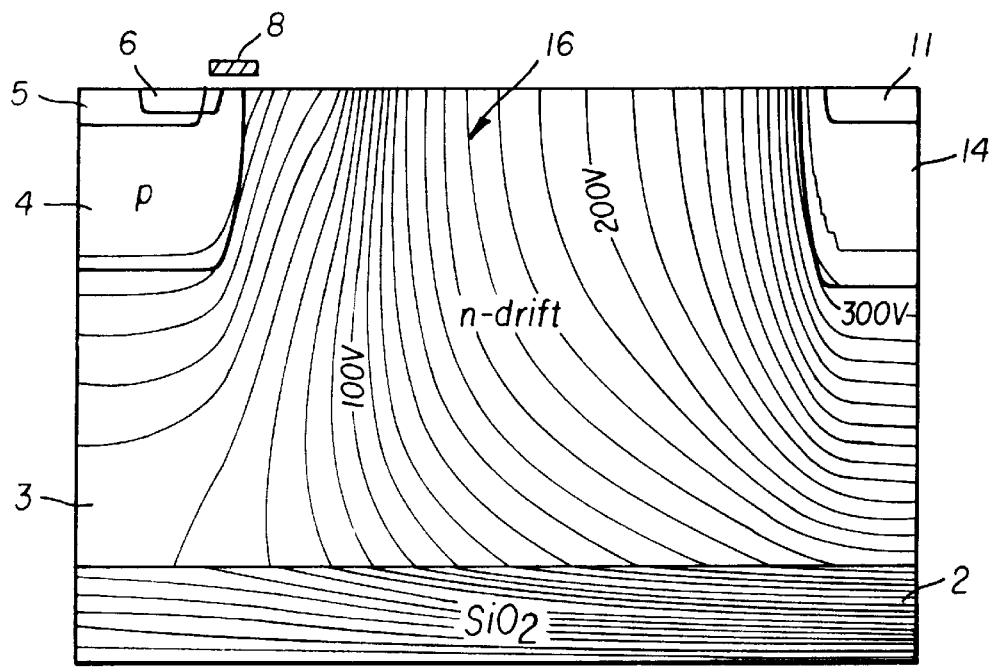
FIG. 7 is a potential distribution diagram showing the potential distribution inside the device, when a high voltage is applied to the lateral MOSFET formed on the SOI substrate.

In FIG. 2(a), the p well region 44 is formed in a surface layer of the n type semiconductor substrate 40 formed on a bonding oxide film that is not illustrated, and the p+ contact region 45 is formed in a surface layer of the p well region 44, though the n+ source region 6 as shown in FIG. 6 is not formed. The n buffer region 14 is formed in a surface layer of the n type semiconductor region 40, apart from the p well region 44, and then n+ drain region 11 is formed in a surface layer of the n buffer region 14. The gate electrode 8 is formed over the p well region 44 with the gate oxide film 7 interposed therebetween, and the source electrode 9 is formed on the n+ contact region 45, while the drain electrode 12 is formed on the n+ drain region 11. The gate electrode 8, source electrode 9 and the drain electrode 12 are respectively connected to the gate terminal G, source terminal S and the drain terminal D. The n type semiconductor substrate 40 that is interposed between the n+ drain region 11 and the p well region 44 provides an n drift region 3. FIG. 2(a) is different from FIG. 6 in that the n+ source region 6 of FIG. 6 is not formed.

FIG. 2(b) is different from FIG. 2(a) in that the n+ source region corresponding to the n+ source region 6 of FIG. 6 is formed, and the source electrode 9 is formed on the n+ source region 46 and the p+ contact region 45. Thus, the structure of FIG. 2(b) is identical with the conventional structure as shown in FIG. 6. In operation, electron streams 49 are caused to flow from the n+ source region 46 into the n drift region 3, through an n channel formed in the surface of the p well region 44 located right under the gate electrode 8, and further into the n+ drain region 11 through the n buffer region 14.

Since the n+ source region 46 and the n+ drain region 11 that are opposed to each other extend in parallel with each other in the straight portion 48, the electron streams 49 flow uniformly into the n+ drain region 11, causing no concentration of the electron streams 49 at around the n+ drain region 11. Accordingly, the lateral MOSFET has an increased ON breakdown voltage.

The length of the n drift region 3 (i.e., drift length L in FIG. 2(b)) may be reduced in the presence of the n buffer region 14 that functions to prevent extension of a depletion layer. Thus, the chip size can be reduced. Also, the impurity concentration of the n buffer region 14 may be controlled to be lower than that of the n+ drain region 11, thereby to reduce the intensity of the electric field that is likely to be high on the drain side, and thus increase the ON breakdown voltage.

The n buffer region 14 as indicated above may not be formed in a device having a relatively low breakdown voltage in which the extension of the depletion layer is small.

Figure 3A:
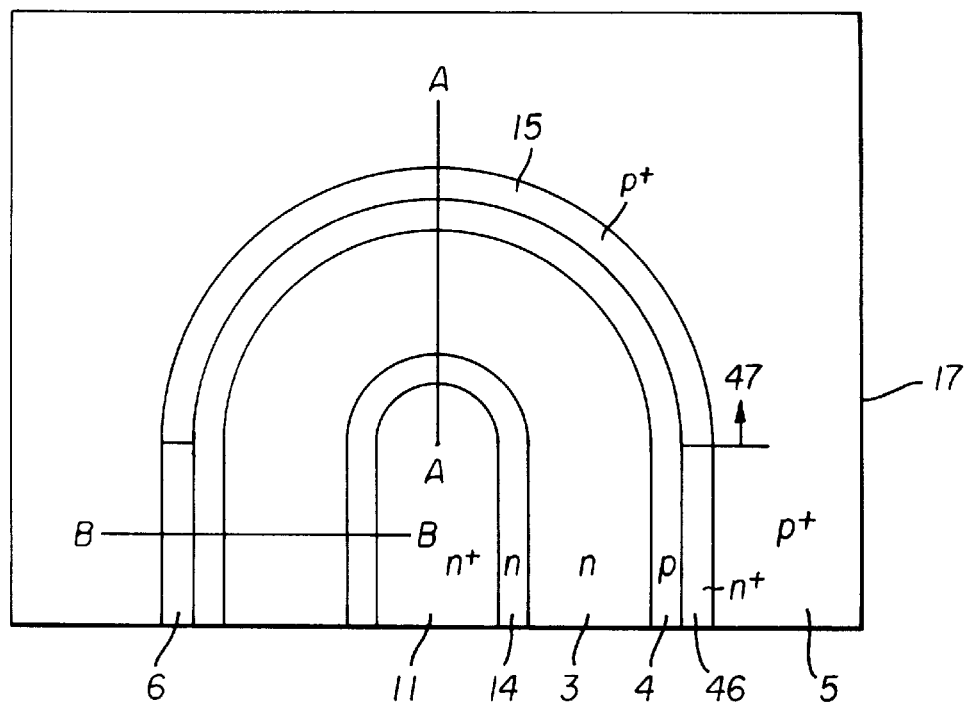
FIG. 3(a) is a plan view of a drain corner of a high voltage lateral semiconductor device according to the second embodiment of the present invention.
Figure 3B:
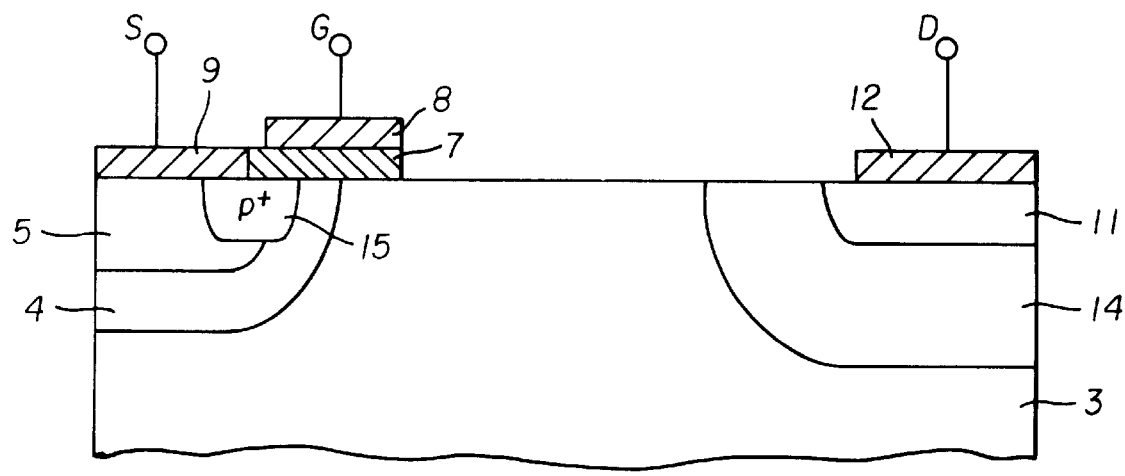
FIG. 3(b) is a cross-sectional view of the drain corner, taken along line A—A of FIG. 3(a)

FIG. 3(a) is a plan view of a drain corner of a high voltage lateral semiconductor device according to the second embodiment of the present invention, and FIG. 3(b) is a cross-sectional view taken along line A—A of FIG. 3(a). A cross-sectional view taken along line B—B of FIG. 3(a) is identical with that of FIG. 2(b), and therefore will not be provided herein.

FIG. 3(a) and FIG. 3(b) are different from FIG. 1 and FIG. 2(a), respectively, in that a p+ region 15 is formed in the circular arc portion 47 of FIG. 1. The provision of the p+ region 15 makes it possible to prevent injection of electrons from the n+ source region 46 that is in contact with the p+ contact region 5. Thus, the injection of electrons through a contact face between the circular arc portion 47 and the straight portion 48 can be prevented, causing no concentration of the electron streams 49 at the contact face, thus assuring an increased ON breakdown voltage. With the p+ region 15 thus formed, the p+ contact region 5 may expand in the circular arc portion 47, resulting in reduced contact resistance. The p+ region 15 thus formed may completely surround the p well region 4 of the circular arc portion 47, or may protrude into the n drift region 3.

Figure 4A:
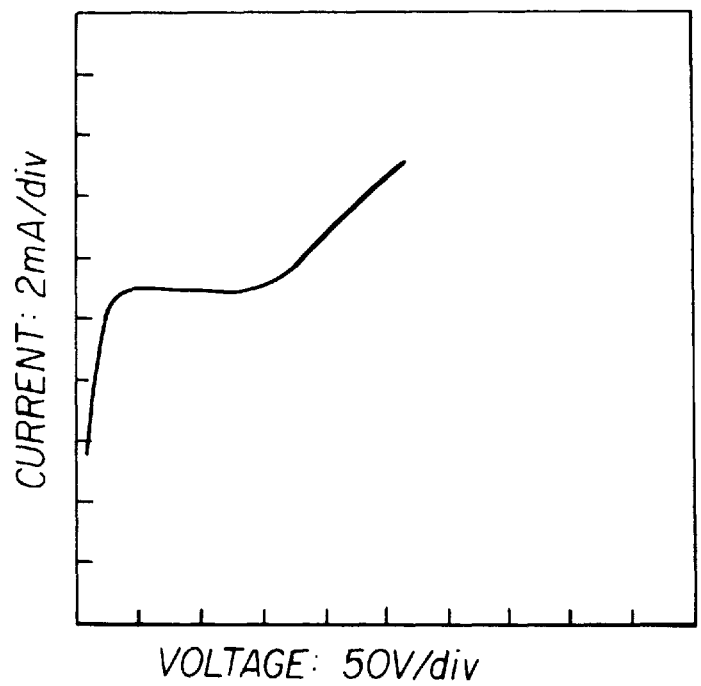
FIG. 4(a) is a graph showing a voltage-current curve obtained at the room temperature with respect to the device of the present invention.
Figure 4B:
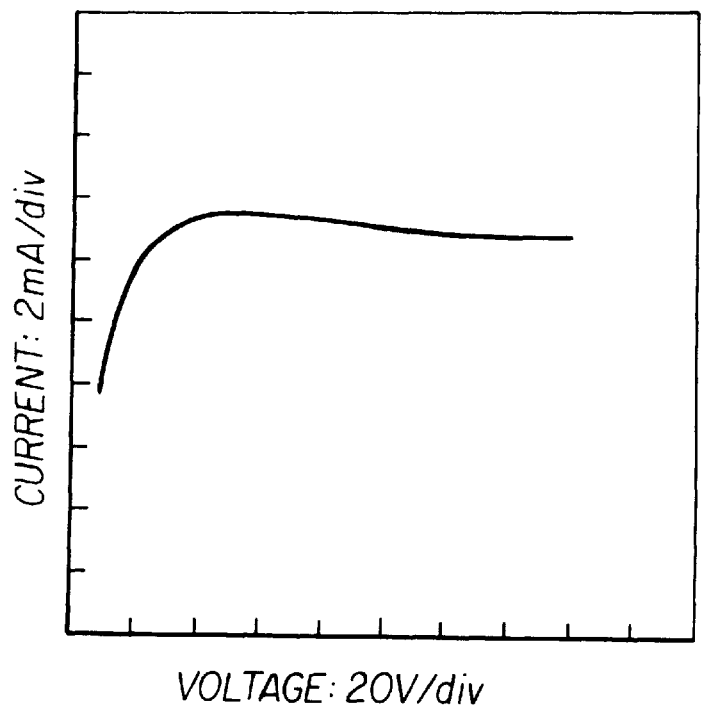
FIG. 4(b) is a graph showing a voltage-current curve obtained at the room temperature with respect to a conventional device.
Figure 5:
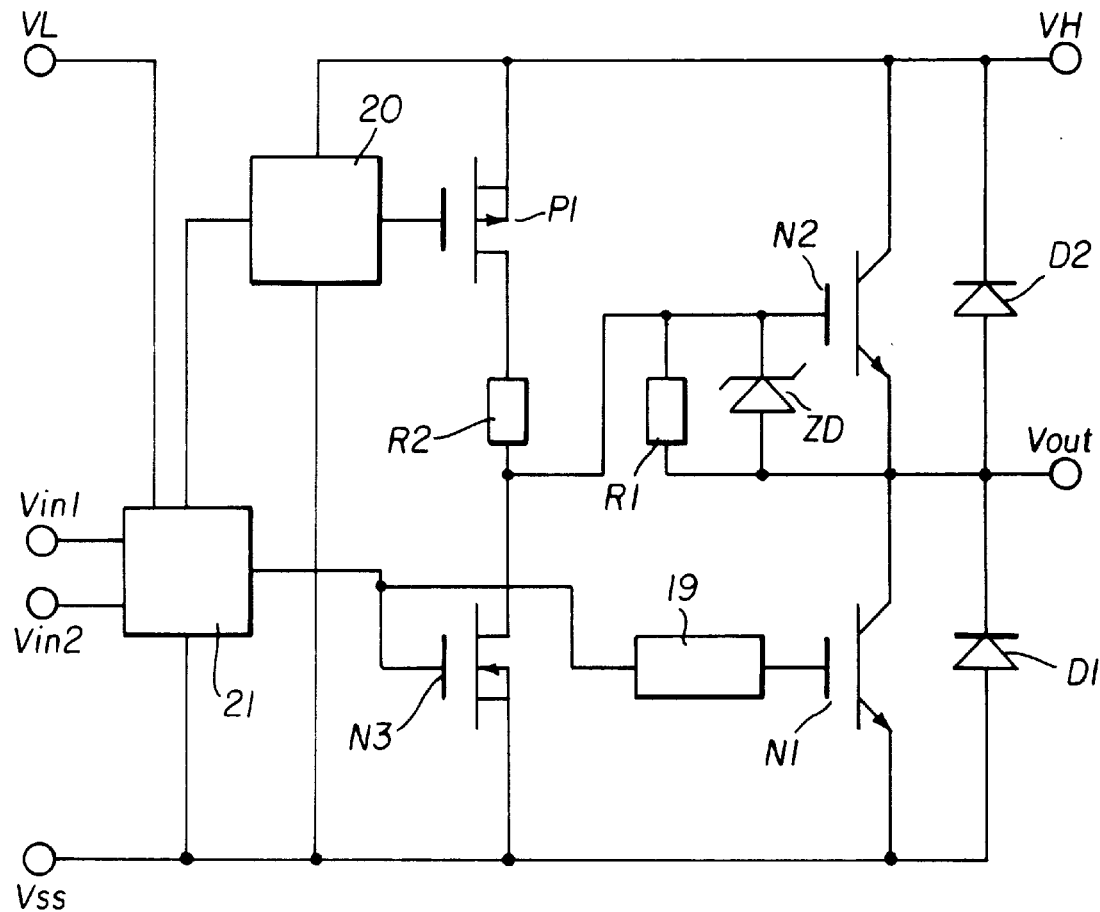
FIG. 5 is a view showing, by way of example, an output circuit of a high voltage power IC.

FIG. 4(a) shows a voltage-current curve representing the relationship between voltage and current measured at the room temperature in the device of the present invention having the structure of FIG. 1 and FIG. 4(b) shows a voltage-current curve representing the relationship between voltage and current measured at the room temperature in the conventional device having the structure of FIG. 6. In FIGS. 4(a) and 4(b), the vertical axis indicates the current (drain current), and the horizontal axis indicates the voltage (drain voltage). The drain voltage and current were measured when a gate voltage of 6 V was applied to each of the devices. The voltage at the right-hand end point of each voltage-current curve indicates the ON breakdown voltage.

To fabricate each of the device of the present invention and the conventional device, the n type semiconductor substrate 40, the n+ source region 6 and the n+ drain region 11 were formed in a 10 μm-thickness n type semiconductor substrate 40 having a 1 μm-thickness bonding oxide film 2. The thickness of the n drift region 3 was accordingly 10 μm, and the thickness of the gate oxide film 7 was 25 nm. The n+ source region 6 was present in the circular arc portion 47 of the drain corner 17 in the conventional device, whereas no n+ source region was formed in the circular arc portion 47 in the device of the present invention.

With regard to the conventional device of FIG. 4(b), the avalanche current started increasing once the drain voltage exceeded 160 V. This device with a low capability to withstand avalanche breakdown instantly broke down once the avalanche current started increasing. The ON breakdown voltage of the conventional device was 160 V. The device of the present invention of FIG. 4(a), on the other hand, did not break down even if the drain voltage exceeded 160 V, or even exceeded 250 V, wile the current slowly increased, thus showing a high capability to withstand breakdown. The ON breakdown voltage of the device of the present invention was 270 V. Thus, the structure of the device of the present invention is considerably effective to increase the ON breakdown voltage. When the device of the present invention having the structure of FIG. 1 was replaced by that having the structure of FIG. 3, the ON breakdown voltage was slightly increased as compared with that of the device of FIG. 1, and the contact resistance was advantageously reduced.

According to the present invention, the high voltage lateral semiconductor device formed on the SOI substrate, and n+ source region that supplies electrons as majority carriers is not formed in the circular arc portion of the drain corner at which the surface electric field becomes highest. With this arrangement, electrons as majority carriers are prevented from being injected into a conventionally high electric-field region in the circular arc portion, and thus avalanche multiplication can be suppressed in the drain corner. Consequently, the ON-state breakdown characteristic of the device can be improved.

Also, if the p+ region is formed in the circular arc portion of the drain corner, the ON-state breakdown characteristic can be further improved, and the contact resistance can be advantageously reduced.

In addition to the structures as described above, the n buffer region may be provided so as to reduce the chip size.

What is claimed is:

1. A high voltage lateral semiconductor device, comprising:

a first semiconductor substrate;

a first-conductivity-type second semiconductor substrate that is bonded to the first semiconductor substrate with an oxide film interposed therebetween, to provide a bonded substrate structure, said second semiconductor substrate being polished to have a desired thickness;

a second-conductivity-type well region formed in a selected portion of a surface layer of the second semiconductor substrate;

a high-impurity-concentration second-conductivity-type contact region formed in a selected portion of a surface layer of the second-conductivity-type well region;

a first-conductivity-type source region formed in a selected portion of the surface layer of the second-conductivity-type well region, such that the source region overlaps the second-conductivity-type contact region;

a gate electrode layer formed on a gate insulating film, over a part of the second-conductivity-type well region that is interposed between the first-conductivity-type source region and the second semiconductor substrate;

a source electrode formed on the second-conductivity-type contact region and the first-conductivity-type source region;

a high-impurity-concentration first-conductivity-type drain region that is formed in a selected portion of the surface layer of the second semiconductor substrate, apart from the second-conductivity-type well region; and a drain electrode formed on the first-conductivity-type drain region;

wherein a surface pattern including the second-conductivity-type well region and the first-conductivity-type drain region is formed in an island-like shape in which one of the well region and the drain region surrounds the other thereof, or in a comb-like shape in which the well region and the drain region surround each other; and wherein the first-conductivity-type source region is not formed at a location where an edge line of the second-conductivity-type well region is opposed to an edge line of the first-conductivity-type drain region, and the length of the edge line of the second-conductivity-type well region is larger than that of the edge line of the first-conductivity-type drain region.

2. A high voltage lateral semiconductor device according to claim 1, wherein a high-impurity-concentration second-conductivity-type semiconductor region is formed at the location where the first-conductivity-type source region is not formed.

3. A high voltage lateral semiconductor device according to claim 1, further comprising a first-conductivity-type buffer region having a higher impurity concentration than the second semiconductor substrate, said first-conductivity-type buffer region being formed apart from the second-conductivity-type well region, so as to surround the first-conductivity-type drain region.

4. A high voltage lateral semiconductor device according to claim 1, wherein the first-conductivity-type source region is not formed in a circular arc portion of a drain corner.

* * * * *